US006718301B1

(12) United States Patent
Woods

(10) Patent No.: US 6,718,301 B1
(45) Date of Patent: Apr. 6, 2004

(54) SYSTEM FOR MEASURING SPEECH CONTENT IN SOUND

(75) Inventor: William S. Woods, Minneapolis, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

(21) Appl. No.: 09/189,668

(22) Filed: Nov. 11, 1998

(51) Int. Cl.$^7$ .............................................. G10L 11/06
(52) U.S. Cl. ...................................... 704/233; 704/226
(58) Field of Search ............................... 704/215, 228, 704/233

(56) References Cited

U.S. PATENT DOCUMENTS

| | | | |
|---|---|---|---|
| 3,527,901 A | | 9/1970 | Geib |
| 4,074,264 A | * | 2/1978 | Wilmot ........................ 342/90 |
| 4,366,349 A | | 12/1982 | Adelman .................... 179/107 |
| 4,396,806 A | | 8/1983 | Anderson ................... 179/107 |

(List continued on next page.)

FOREIGN PATENT DOCUMENTS

WO   WO-00/21332   4/2000

OTHER PUBLICATIONS

Mischa Schwartz, William R. Bennett, and Seymour Stein, Communication Systems and Techniques, McGraw-Hill, 1966, p. 30, 36, and 103.*

Griffing, Terry S., et al., "Acoustical Efficiency of Canal ITE Aids", *Audecibel*, (Spring 1983), 30–31.
Griffing, Terry S., et al., "Custom canal and mini in–the–ear hearing aids", *Hearing Instruments*, vol. 34, No. 2, (Feb. 1983), 31–32.
Griffing, Terry S., et al., "How to evaluate, sell, fit and modify canal aids", *Hearing Instruments*, vol. 35, No. 2, (Feb. 1984), 3.
Mahon, William J., "Hearing Aids Get a Presidential Endorsement", *The Hearing Journal*,,(Oct. 1983), 7–8.
Sullivan, Roy F., "Custom canal and concha hearing instruments: A real ear comparison", *Hearing Instruments*, vol. 40, No. 4, (Jul. 1989), 5.
Sullivan, Roy F., "Custom canal and concha hearing instruments: A real ear comparison Part II", *Hearing Instruments*, vol. 40, No. 7, (Jul. 1989),6.
Elberling, C., et al., "The Design and Testing of a Noise Reduction Algorithm Based on Spectral Subtraction", *Scand Audiol, Suppl. 38*, 39–49, (1993).
Ludvigsen, C., "Comparison of Certain Measures of Speech and Noise Level", *Scand Audiol, 21*, 23–29, (1992).

*Primary Examiner*—Susan McFadden
(74) *Attorney, Agent, or Firm*—Schwegman, Lundberg, Woessner & Kluth, P.A.

(57) ABSTRACT

A system for measuring speech content in sound. The system determining time local speech-to-noise ratio for one or more bands. The system using a signal related to the power of the input signal or envelope and generating a time-dependent mean of the envelope and deviation of the envelope from the mean to estimate a time-dependent speech-to-noise ratio. The system providing single band or multiband speech-to-noise estimates for signal processing applications. The system realizable in analog, digital or analog and digital combinations.

41 Claims, 17 Drawing Sheets

U.S. PATENT DOCUMENTS

| | | | |
|---|---|---|---|
| 4,419,544 A | 12/1983 | Adelman | 179/107 |
| 4,471,490 A | 9/1984 | Bellafiore | 381/69 |
| 4,627,103 A | 12/1986 | Fukuhara | 455/226 |
| 4,628,529 A | 12/1986 | Borth et al. | 381/94 |
| 4,630,304 A | 12/1986 | Borth et al. | 381/94 |
| 4,637,402 A | 1/1987 | Adelman | 128/746 |
| 4,811,404 A | 3/1989 | Vilmur et al. | 381/94 |
| 4,852,175 A | 7/1989 | Kates | 381/68.4 |
| 4,882,762 A | 11/1989 | Waldhauer | |
| 4,887,299 A | 12/1989 | Cummins et al. | 381/68.4 |
| 5,012,519 A | 4/1991 | Adlersberg et al. | 381/47 |
| 5,185,168 A | 2/1993 | Takahashi | 426/233 |
| 5,267,322 A | 11/1993 | Smith et al. | 381/107 |
| 5,323,337 A | 6/1994 | Wilson et al. | 364/574 |
| 5,390,254 A | 2/1995 | Adelman | 381/68 |
| 5,434,924 A | 7/1995 | Jampolsky | 381/68.4 |
| 5,502,769 A | 3/1996 | Gilbertson | 381/68 |
| 5,544,250 A * | 8/1996 | Urbanski | 381/94.3 |
| 5,550,924 A | 8/1996 | Helf et al. | 381/94 |
| 5,553,152 A | 9/1996 | Newton | 381/68.6 |
| 5,581,747 A | 12/1996 | Anderson | 395/551 |
| 5,659,621 A | 8/1997 | Newton | 381/68 |
| 5,687,241 A | 11/1997 | Ludvigsen | 381/68.4 |
| 5,757,933 A | 5/1998 | Preves et al. | 381/68 |
| 5,822,442 A | 10/1998 | Agnew et al. | 381/107 |
| 5,825,631 A | 10/1998 | Prchal | 361/790 |
| 5,835,611 A | 11/1998 | Kaiser et al. | 381/321 |
| 5,852,668 A | 12/1998 | Ishige et al. | 381/312 |
| 5,862,238 A | 1/1999 | Agnew et al. | 381/321 |
| 5,884,255 A * | 3/1999 | Cox | 704/233 |
| 6,041,129 A | 3/2000 | Adelman | 381/328 |
| 6,175,634 B1 * | 1/2001 | Graumann | 381/94.1 |
| 6,236,731 B1 | 5/2001 | Brennan et al. | 381/316 |
| 6,240,192 B1 | 5/2001 | Brennan et al. | 381/314 |
| 6,347,148 B1 | 2/2002 | Brennan et al. | |
| 6,366,863 B1 | 4/2002 | Bye et al. | 702/57 |
| 6,389,142 B1 | 5/2002 | Hagen et al. | 381/313 |
| 6,449,662 B1 | 9/2002 | Armitage | 710/8 |
| 2001/0007050 A1 | 7/2001 | Adelman | 600/150 |
| 2002/0076073 A1 | 6/2002 | Taenzer | 381/315 |

* cited by examiner

SYSTEM FOR MEASURING SPEECH CONTENT IN SOUND

FIELD OF THE INVENTION

This invention relates generally to signal processing, and more particularly to a system for measuring speech content in sound.

BACKGROUND

A difficult problem for scientists in voice recognition is to electronically differentiate speech-like sound from other sounds. Speech-like sound is sound with a time-frequency description that changes like that of speech sounds. The human brain is very capable of recognizing the difference between speech-like sounds and other sounds. For example, humans can easily differentiate between the sibilant whirring of computer fan noise and a person talking. However, it is extremely complicated to produce electronics which can tell the difference between noises and speech-like sound. One of the complications is that the noises we hear have energy in much the same frequencies as speech-like sound. Another complication is that some vocalizations are not simple talking and therefore may have sound characteristics which are closer to non-speech sound than speech-like sound. Yet another complication is that there are a variety of different speech-like sounds which demonstrate substantially different characteristics. For example, the characteristics of simple talking compared to singing are readily distinguishable to the human ear, yet such differences may confuse systems attempting to electronically differentiate speech-like sound from other sounds.

Thus, there is a need in the art for a system which differentiates speech-like sound from other sounds. The system should be able to characterize vocalizations which are not simple talking. Furthermore, the system should be useful for differentiating a variety of different kinds of speech-like sounds from other sounds.

SUMMARY OF THE INVENTION

Upon reading and understanding the present disclosure it is recognized that the inventive subject matter described herein satisfies the foregoing needs in the art and several other needs in the art not expressly noted herein. The following summary is provided to give the reader a summary which is not intended to be exhaustive or limiting and the scope of the invention is provided by the attached claims and the equivalents thereof.

One embodiment of the present invention provides a method and apparatus for a system for measuring speech content in sound. In one embodiment a method is provided for receiving an input signal; extracting a signal related to a time-dependent power of the input signal; determining a time-dependent mean of the signal, M; determining a time-dependent deviation of the signal from the mean, D; and estimating a time-dependent speech-to-noise ratio from M and D. In one embodiment, the extracted signal is an envelope produced using a non-negative function of the input signal. In one embodiment, the estimating includes comparing M and D to a predetermined mapping of a relationship between M and D to speech-to-noise ratio to obtain an estimated speech-to-noise ratio. Embodiments in which the deviation D is the standard deviation are demonstrated. Other deviations are demonstrated. Various analog and digital embodiments are demonstrated herein. Single band and multiple band embodiments are provided. Various filtering systems are demonstrated, including recursive and nonrecursive. Multiple signal extraction methods are demonstrated. Uses of the estimated time-dependent speech-to-noise ratios are demonstrated.

In one embodiment apparatus and process are provided relating to a system receiving an audio signal; converting the audio signal to an electrical signal; converting the electrical signal to a digital representation; bandpass filtering the signal using one or more digital filters to produce a plurality of filtered digital signals; for each digital signal of the plurality of filtered digital signals: extracting an envelope related to a time-dependent power of the signal; determining a time-dependent mean of the envelope, M; determining a time-dependent deviation of the envelope from the mean, D; and estimating a time-dependent speech-to-noise ratio from M and D using a predetermined mapping or relationship between M and D to speech-to-noise ratio; producing a processed digital signal using the plurality of filtered digital signals and their respective estimated time-dependent speech-to-noise ratios; and converting the processed digital signal to a processed analog signal. Alternate embodiments are provided to demonstrate the subject matter of the present patent application. Several applications of the present subject matter are discussed.

BRIEF DESCRIPTION OF THE DRAWINGS

A more complete understanding of the invention and its various features, objects and advantages may be obtained from a consideration of the following detailed description, the appended claims, and the attached drawings in which:

DETAILED DESCRIPTION

In the following detailed description, reference is made to the accompanying drawings which form a part hereof and in which is shown by way of illustration specific embodiments in which the invention can be practiced. These embodiments are described in sufficient detail to enable those skilled in the art to practice and use the invention, and it is to be understood that other embodiments may be utilized and that electrical, logical, and structural changes may be made without departing from the spirit and scope of the present invention. The following detailed description is, therefore, not to be taken in a limiting sense and the scope of the present invention is defined by the appended claims and their equivalents.

Figure 1:
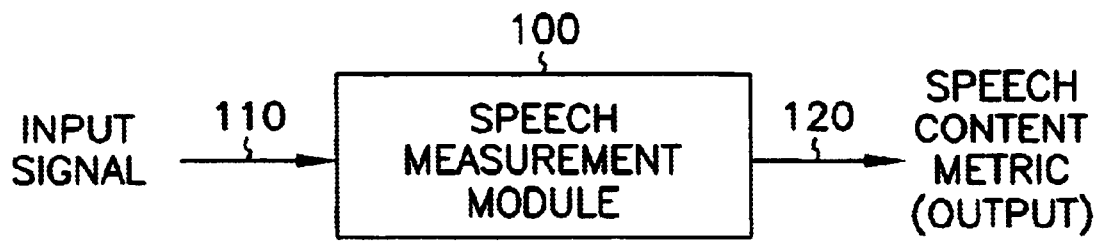
FIG. 1 illustrates generally a block diagram of a system for measurement of speech content in sound whereby input signals are processed by a speech measurement module to produce an output signal which is a measure of the speech content of the input signals.

FIG. 1 illustrates generally a block diagram of a system for measurement of speech content in sound whereby input signal 110 is processed by a speech measurement module 100 to produce an output signal 120 which is a measure of the speech content of the input signal 110. In one embodiment, the speech measurement module 100 includes analog electronics. In another embodiment, the speech measurement module 100 includes digital electronics. In yet another embodiment, speech measurement module 100 is a combination of digital and analog electronics. Speech measurement module 100 may be embodied in hardware, software, or a combination of hardware and software. It may also be embodied in programmable devices or in dedicated devices. Several embodiments are provided in the following detailed description. Other embodiments are possible and the embodiments herein are intended to demonstrate the present invention and are not intended in an exhaustive or exclusive sense.

Figure 2:
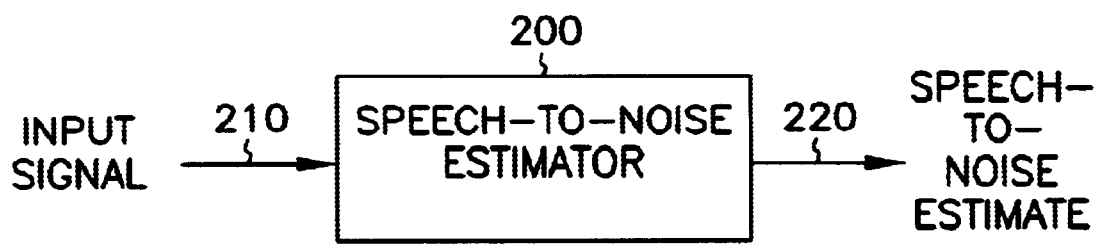
FIG. 2 shows a block diagram of a speech-to-noise estimator, which is one embodiment of a speech measurement module as shown in FIG. 1.

FIG. 2 shows a block diagram of a speech-to-noise estimator 200, which is one embodiment of a speech measurement module 100 as shown in FIG. 1. Speech-to-noise ratio is any quantity directly related to the ratio of power of speech-like sounds to the power of other sounds over an interval of time. In one embodiment of the present system, the speech-to-noise ratio is generated using a signal directly related to the power of the input signal 210, which signal shall be called the "envelope". The speech-to-noise ratio of the input signal 210 in a time interval is inversely related to the ratio of the mean of the envelope ("M") to the deviation of the envelope from the mean ("D").

In one embodiment, the time-dependent M and D pairs are compared to a predetermined mapping of speech-to-noise ratio to M/D to estimate time-dependent speech-to-noise ratio. In one embodiment an empirical study is performed to record a mapping of speech-to-noise ratio to M/D. In one embodiment, the M/D ratios are stored for different speech-to-noise ratios. In one embodiment, a speech-to-noise estimate is obtained using a look up table for M/D ratio. In yet another embodiment a natural relationship between the M/D ratio and speech-to-noise ratio may be used to derive a mathematical model of the mapping.

In one embodiment the mapping is calculated from an equation modeling the mapping of speech-to-noise ratio to MID. In one embodiment, the mapping is modeled using a polynomial equation with coefficients selected to provide a best fit for the mapping.

In one embodiment, the deviation D is the statistical standard deviation. Other deviations may be used without departing from the present system. Certain benefits, such as speed of calculation, may be obtained using different types of deviations.

In one embodiment the M/D ratios may be filtered prior to obtaining the speech-to-noise ratio estimates to reduce fluctuations in the estimates. Additionally, the filtering may be performed on the resulting speech-to-noise estimates after obtaining the estimates to reduce fluctuations in the estimates. Various filtering processes may be employed, including, but not limited to, low pass filtering the M/D ratios or the resulting estimates of speech-to-noise ratios.

Figure 4:
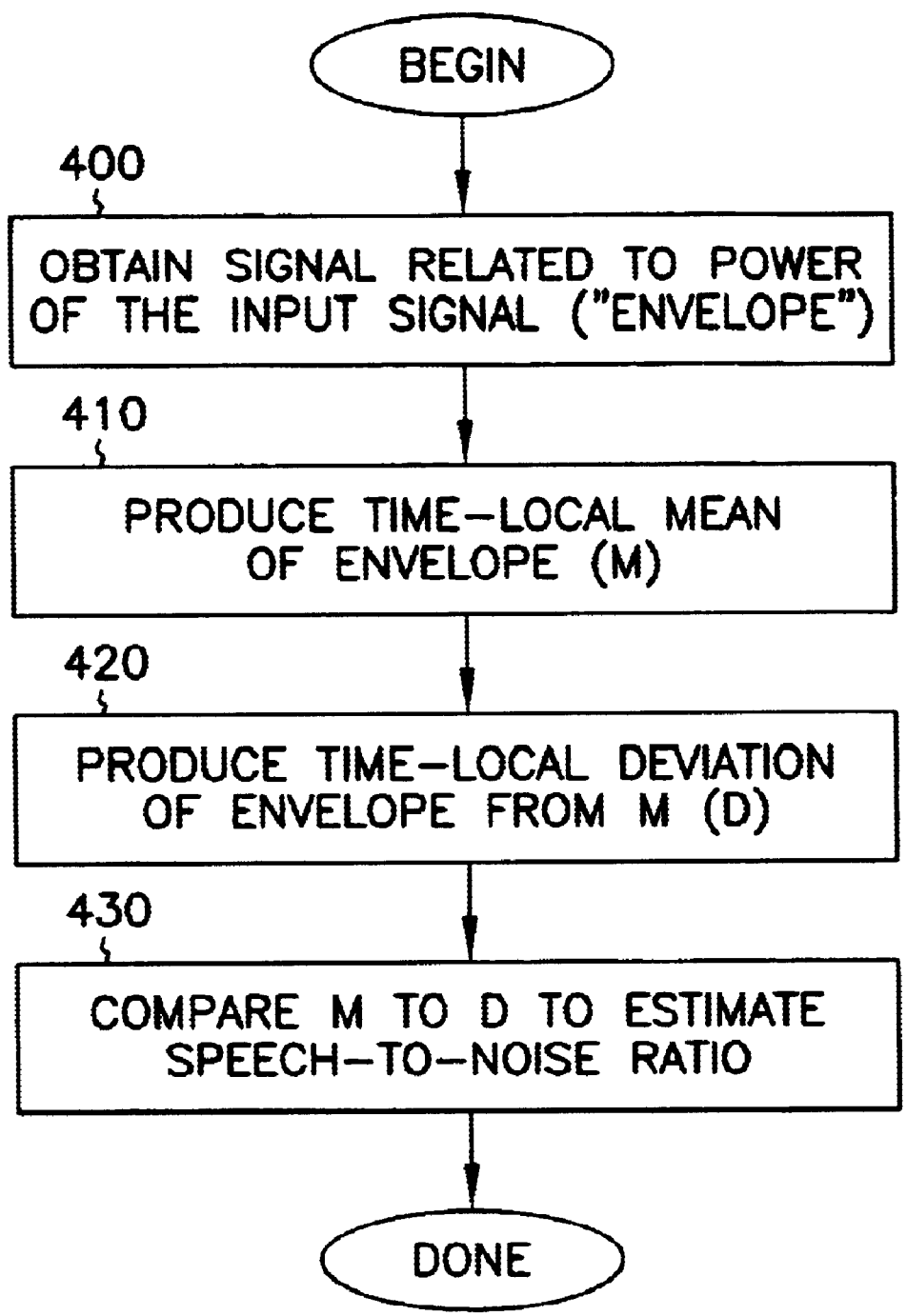
FIG. 4 is a flow diagram showing estimation of speech-to-noise ratio according to one embodiment of the present system.

FIG. 4 is a flow diagram showing a process for generating a time-dependent estimate of speech-to-noise ratio according to one embodiment of the present system. A signal related to the power of the input signal (the envelope) is obtained 400. A time-dependent mean of the envelope M is produced 410. A time-dependent deviation of the envelope from the time-dependent mean D is produced 420. In some embodiments M and D are a function of previous time intervals weighted accordingly. M and D are compared to estimate a speech-to-noise ratio 430. In one embodiment this process is repeated to perform a plurality of speech-to-noise estimates. In one embodiment, block 430 performs filtering of the M/D ratios prior to estimation of speech-to-noise ratios. In one embodiment, block 430 filters the speech-to-noise estimates to produce a filtered estimate. In one embodiment there is no filtering of M/D ratios or of speech-to-noise estimates. In alternate embodiments low pass filtering is performed. Other embodiments exist, and those stated herein are intended to demonstrate the present system, and are not intended to be exclusive or exhaustive of all embodiments.

Figure 10A:
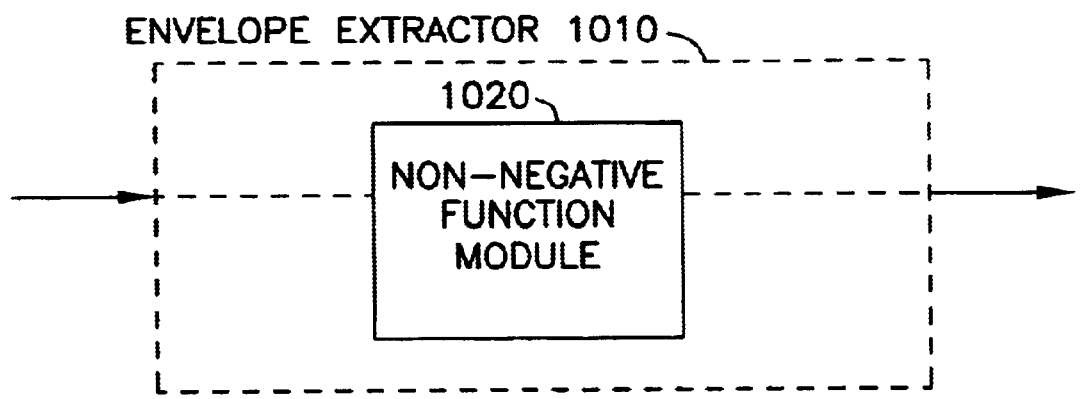
FIG. 10A shows a block diagram of an envelope extractor, according to one embodiment of the present system.
Figure 10B:
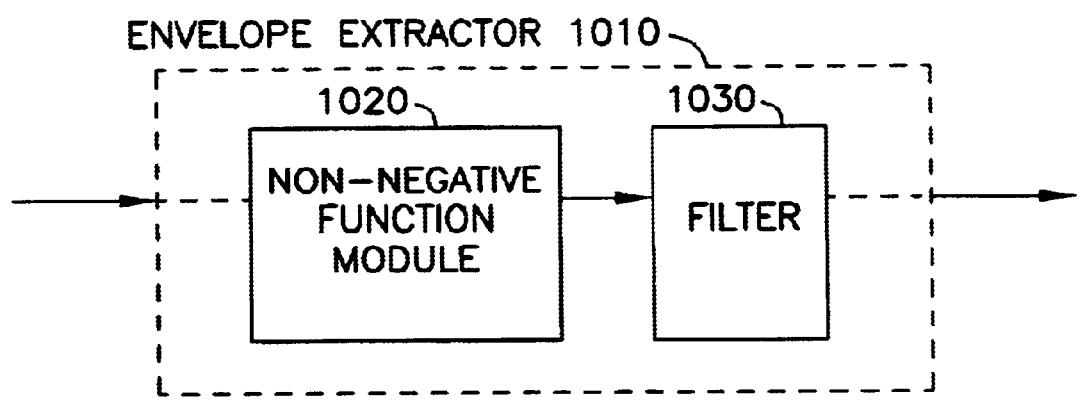
FIG. 10B shows a block diagram of an envelope extractor, according to one embodiment of the present system.
Figure 11A:
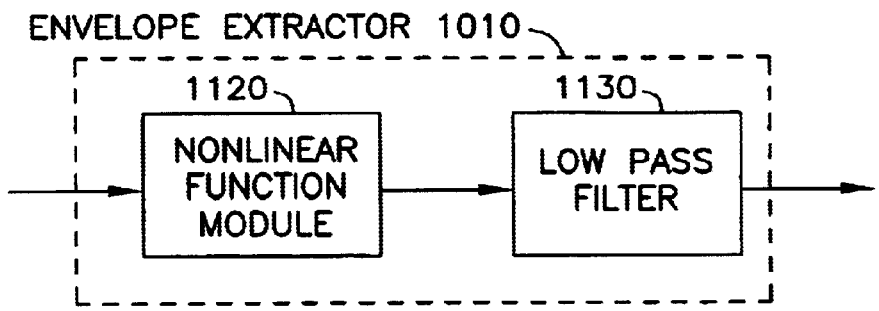
FIG. 11A shows a block diagram of an envelope extractor, according to one embodiment of the present system.
Figure 11B:
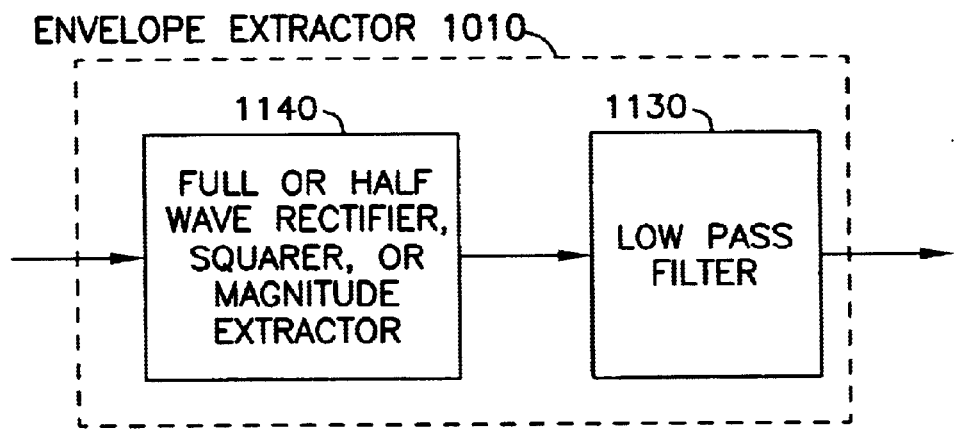
FIG. 11B shows a block diagram of an envelope extractor, according to one embodiment of the present system.
Figure 12:
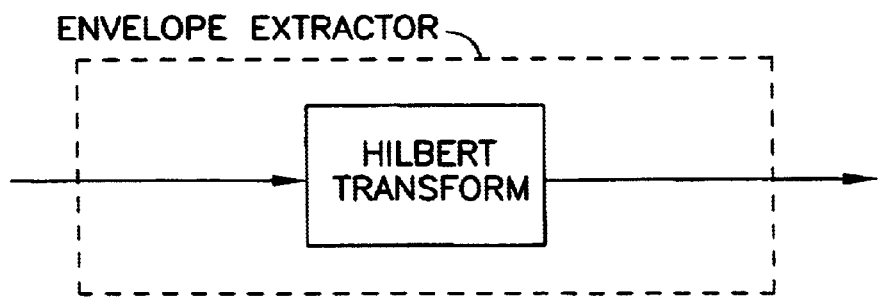
FIG. 12 shows a block diagram of an envelope extractor using a Hilbert transform filter, according to one embodiment of the present system.

The envelope may be produced using several signal processing approaches. Envelope extraction is shown generally in FIG. 10A, in which envelope extractor 1010 includes a non-negative function module 1020, in one embodiment. Non-negative function module 1020 includes, but is not limited to, rectification (full-wave and half-wave), squaring, and magnitude extraction. FIG. 10B shows another embodiment of an envelope extractor 1010 wherein non-negative function module 1020 provides an output which is filtered by filter 1030. In one embodiment, filter 1030 is a low pass filter. FIG. 11A shows one embodiment of envelope extractor 1010 wherein a nonlinear function module 1120 is used as one example of a non-negative function. The output of the nonlinear function module 1120 is low pass filtered by low pass filter 1130. FIG. 11B shows one envelope extractor 1010 wherein the nonlinear functions include full or half wave rectification, squaring, or magnitude extraction 1140. The output is filtered by low pass filter 1130. Other embodiments incorporate a Hilbert transform method, for example, using a Hilbert filter for envelope extraction, as shown in FIG. 12. Other envelope extractors may be used without departing from the present subject matter.

Whatever the system for producing the envelope, the speech-to-noise ratio is produced as a function of the mean of the envelope M compared to deviation of the envelope from the mean D.

Figure 3:
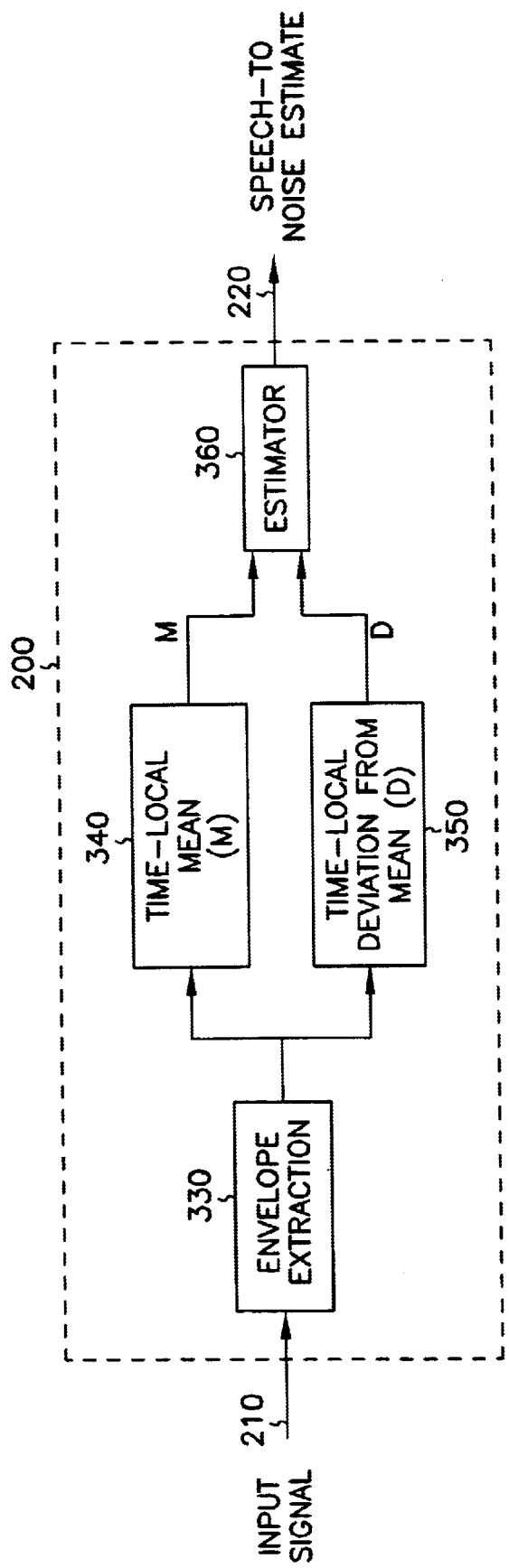
FIG. 3 shows a block diagram of a speech-to-noise estimator according to one embodiment of the present system.

One embodiment of speech-to-noise estimator 200 is shown by FIG. 3. In this embodiment, speech-to-noise estimator 200 produces an envelope using envelope extractor 330 and provides a speech-to-noise estimate 220 of the input signal 210 by comparing a time-dependent mean of the envelope M and a time-dependent deviation from the mean of the envelope D. The time-dependent mean of the envelope M is generated by mean generator 340. The time-dependent deviation from the mean of the envelope D is generated by deviation generator 350. Estimator 360 uses M and D to generate a speech-to-noise estimate 220 of input signal 210.

It was realized that the speech-to-noise content could be characterized in terms of the ratio of M to D. In particular, the speech-to-noise ratio may be estimated by obtaining the ratio of M to D and mapping it to speech-to-noise ratio. In one embodiment of the present system, estimator 360 includes a predetermined mapping of M/D to speech-to-noise ratio. In this embodiment an absolute estimate of speech-to-noise ratio is obtained by comparing the produced ratio of M and D to the predetermined mapping. The resulting estimate of speech-to-noise ratio may be used by a device to determine whether the sampled portion of the input signal 210 contains speech-like sound.

Figure 5A:
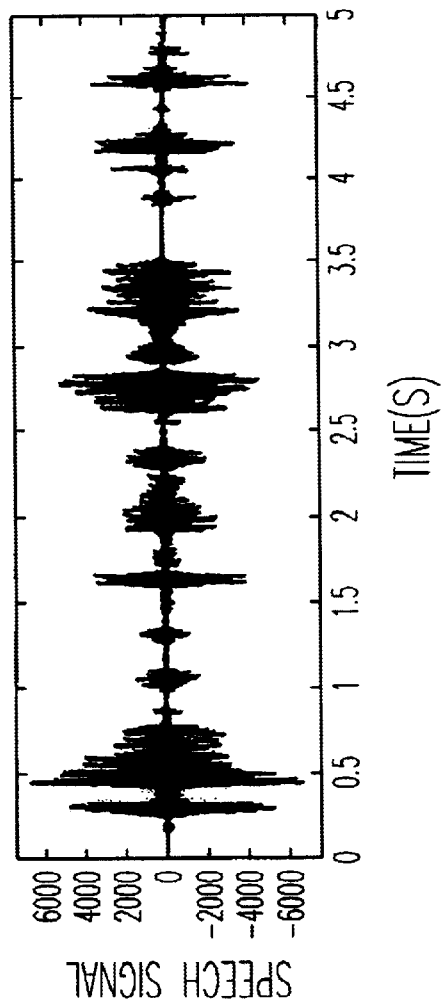
FIG. 5A shows a trace of a sample of speech.
Figure 5B:
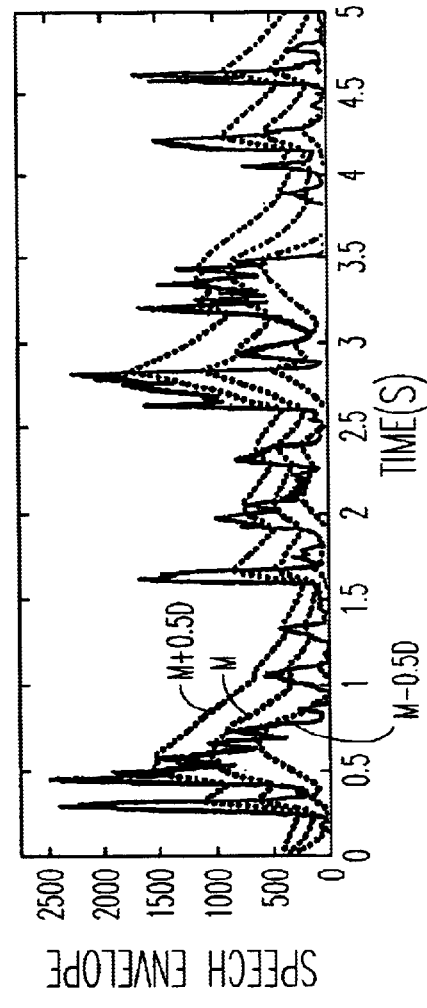
FIG. 5B shows a trace of an envelope of the speech, its mean and a deviation from the mean of the envelope.

FIG. 5A shows a trace of a speech signal over five seconds. The speech signal is modulated by the vocalizations during the five second sample. The breaks in speech show an interesting structure. In this sample, the vertical scale is in arbitrary amplitude units. FIG. 5B is a trace of an envelope representative of the speech signal in FIG. 5A. The envelope in FIG. 5B was produced by low pass filtering the absolute value of the speech signal of FIG. 5A. Also shown in FIG. 5B are the time local mean of the envelope M, and the time-dependent mean plus half the deviation from the mean (M+0.5D) and the time-dependent mean minus half the deviation from the mean (M−0.5D). In this example, the mean is produced by low pass filtering the envelope, and the deviation is produced by low pass filtering the absolute value of the difference between the envelope and the mean. The low pass filtering for the envelope was done with a time constant of 5 milliseconds. The low pass filtering for the mean and deviation was done with a time constant of 500 milliseconds. The times stated in this example were used to demonstrate certain aspects of the present system and are not intended in an exclusive or limiting sense. Other filters may be used without departing from the present system. It is noted that other embodiments use different methods and apparatus for producing the envelope without departing from the present system. Furthermore, other means M and deviations D may be used without departing from the present system, and the examples provided herein are demonstrative and not intended in a limiting or exclusive sense.

In one embodiment, the time constant used for filtering the envelope is selected to avoid loss of the modulations found in speech signals due to oversmoothing of the speech signals. If the speech signals are oversmoothed, then the time-dependent estimate of speech to noise ratio will be inaccurate. In one embodiment, the envelope is filtered using a low pass filter having a time constant of approximately 8 milliseconds to approximately 16 milliseconds (corresponding to a 10–20 Hertz modulation frequency range). In one embodiment time constants less than approximately 100 milliseconds are used. In one embodiment, very short time constants are used for extracting the envelope. In such an embodiment, the time constants are less than approximately 5 milliseconds. In one embodiment, the filter is eliminated and speech-to-noise ratios are calculated using a non-negative function of the input signal without low pass filtering. Other time constants may be used without departing from the present system and the ranges given herein are not intended in an exhaustive sense.

In one embodiment, the time constants used for the filters for mean and deviation generation are selected to (1) yield accurate speech-to-noise estimates and to (2) allow the outputs of the filters to react quickly to changes in speech-to-noise ratio. In one embodiment, time constants in the range of approximately 0.5 seconds to approximately 2.0 seconds may be used to satisfy both conditions. In another embodiment, time constants in the range of approximately 0.5 seconds to approximately 1.0 seconds may be used to satisfy both conditions. In another embodiment, time constants in the range of approximately 1.0 seconds to approximately 2.0 seconds may be used to satisfy both conditions. Subranges of the mentioned ranges and other ranges may be used without departing from the present system. The ranges described herein are not intended to be exhaustive of all possible ranges.

Several different filter designs and types may be used, including analog and digital filter embodiments. Such filters include, but are not limited to infinite impulse response filters and finite impulse response filters. The filters may be recursive or nonrecursive and in several combinations and alternate embodiments.

Figure 5C:
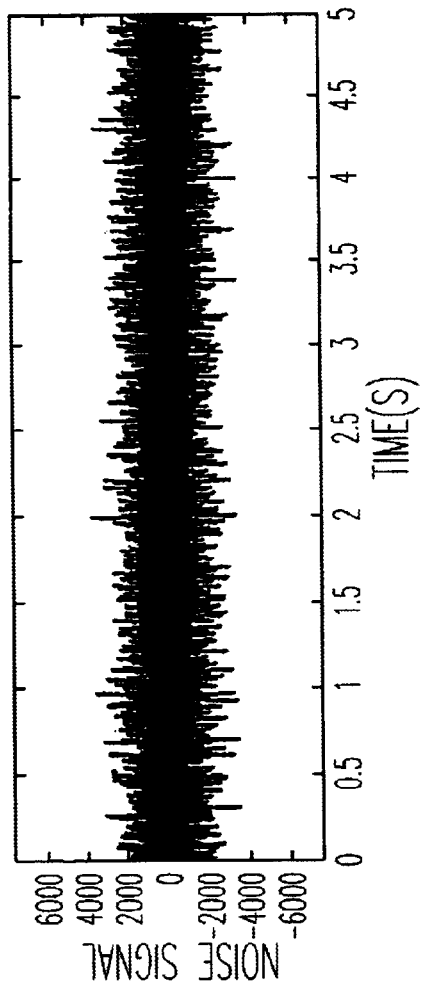
FIG. 5C shows a trace of a sample of noise.
Figure 5D:
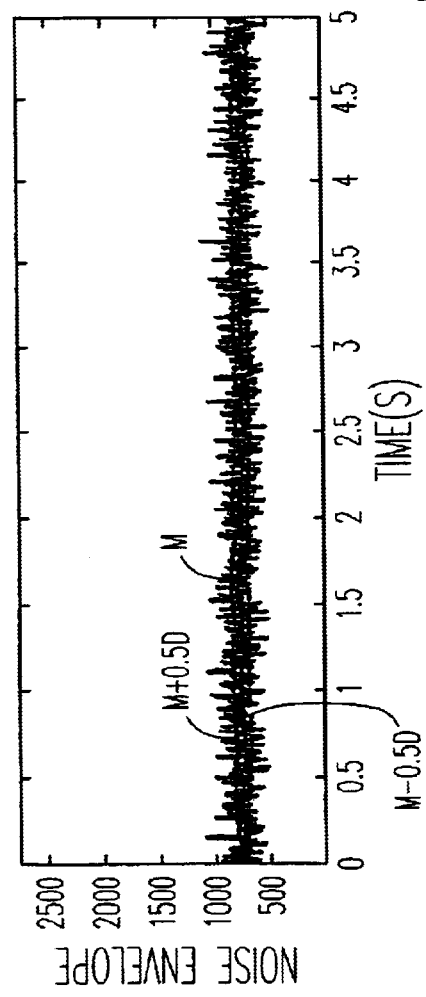
FIG. 5D shows a trace of an envelope of the noise, its mean and a deviation from the mean of the envelope.

FIG. 5C shows a five-second trace of white noise. FIG. 5D shows an envelope produced by the same process as for FIG. 5B. FIG. 5D also shows a time local mean of the envelope M of the noise signal between the time-dependent mean plus half the deviation from the mean (M+0.5D) and the time-dependent mean minus half the deviation from the mean (M−0.5D). Again, these traces were produced using the same process as for the speech envelope of FIG. 5B.

It is therefore observed from FIGS. 5A–5D that the ratio of M/D for the speech signal is less than for the noise signal. This is the result of the relatively high level of modulation of speech signals. This is apparent when the short-term power (or envelope) of speech in different bandpass filter regions is compared to that of continuous noise, as in FIGS.

5A–5D. This distinction arises because of the underlying phase structure of the two signals, which yields a relatively flat envelope for continuous noises (and even speech babble, due to the independence of the underlying speech sources), and a more peaked or modulated envelope for speech. Thus, embodiments which preserve the phase structure and relationship demonstrate a more accurate speech-to-noise ratio estimate. In one embodiment, filtering is performed prior to envelope extraction using a filter with linear phase characteristics to avoid smearing the phase structure of the speech. In one embodiment, a filter with non-linear phase characteristics is used.

It is also noted that in some embodiments, the standard deviation need not be used to obtain a metric related to speech-to-noise ratio. For example, any deviation measurement may be substituted without departing from the scope of the present system. Although any deviation measure could yield useful results, those measures that are linearly related to the envelope will yield a M/D ratio that is independent of the level of the input signal.

In one embodiment, the envelope is extracted and the mean and standard deviation values are determined. In continuous-time applications and in various embodiments these values are efficiently computed using appropriately normalized, first-order, lowpass filters, which will track the mean and standard deviation as a function of time. The mean m(t) and standard deviation s(t) at time t are computed in one discrete-time embodiment as:

$$m(t)=(1-a)m(t-1)+a*e(t)$$

$$s(t)=[(1-a)s^2(t-1)+a*(e(t)-m(t))^2]^{1/2}$$

where e(t) is the envelope under consideration and the parameter a is related to the time constant of the recursive filter. Any other method for lowpass filtering e(t) and (e(t)−m(t)) will preserve the ratio distinction. Single, summary values of the mean and standard deviation can be computed for finite-length segments using any appropriate formulae for the mean and standard deviation. The ratio measure is then m(t)/s(t) for the time-dependent case, and m/s for the summary case.

Another possible embodiment for the mean m(t) and deviation d(t) are provided for example by:

$$m(t)=(1-a)m(t-1)+a*e(t)$$

$$d(t)=[(1-a)d(t-1)+a*ABS(e(t)-m(t))],$$

where ABS( ) is the absolute value of the quantity in parenthesis.

As stated before, in one embodiment, the speech-to-noise ratio is quantified by the ratio of the mean of the envelope to the standard deviation of that envelope. It is expected that the theoretical maximum ratio of the mean to the standard deviation of the envelope is approximately 1.9 for bandpass-filtered, white Gaussian noise (using very long time constants). It has been determined empirically that this ratio is approximately 0.5–0.6 for speech envelopes determined using the same filters. This difference in ratio is preserved even in the wideband signals. Thus, the relatively high level of modulation in the speech increases the size of the standard deviation relative to the mean, and thus decreases this ratio relative to that of the noise.

Figure 6:
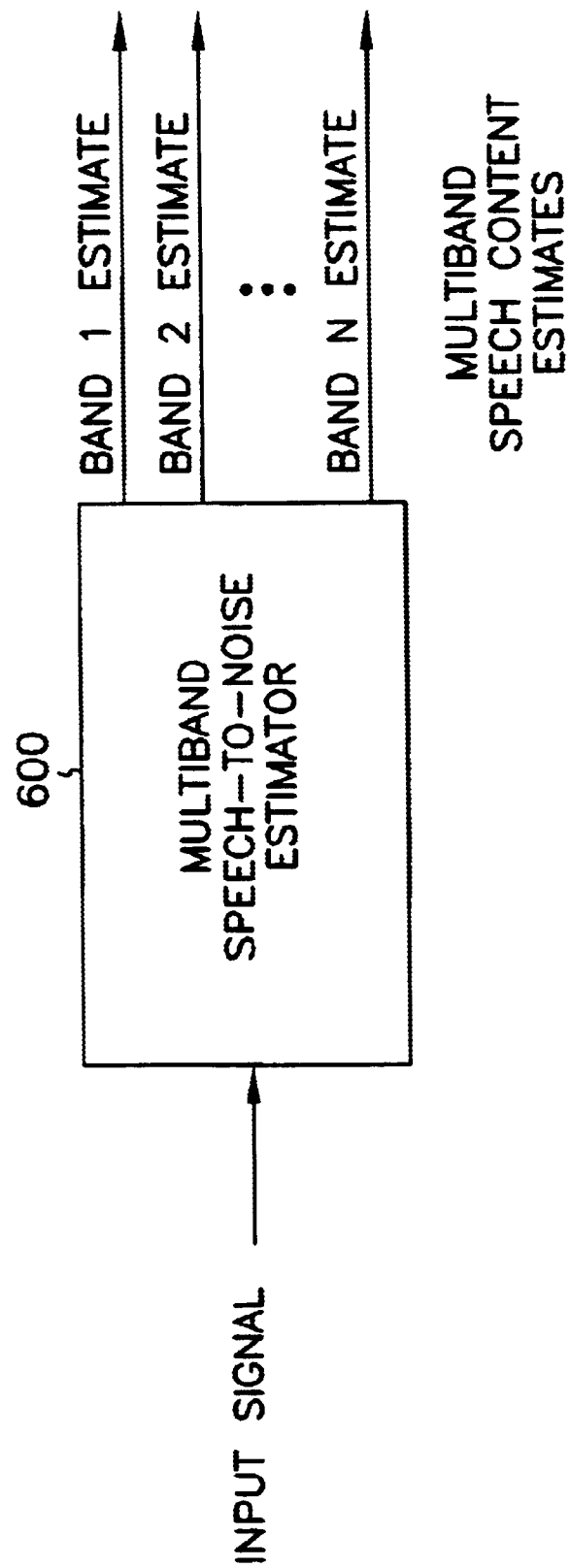
FIG. 6 shows a block diagram of a multiband speech-to-noise estimator, according to one embodiment of the present system.
Figure 7:
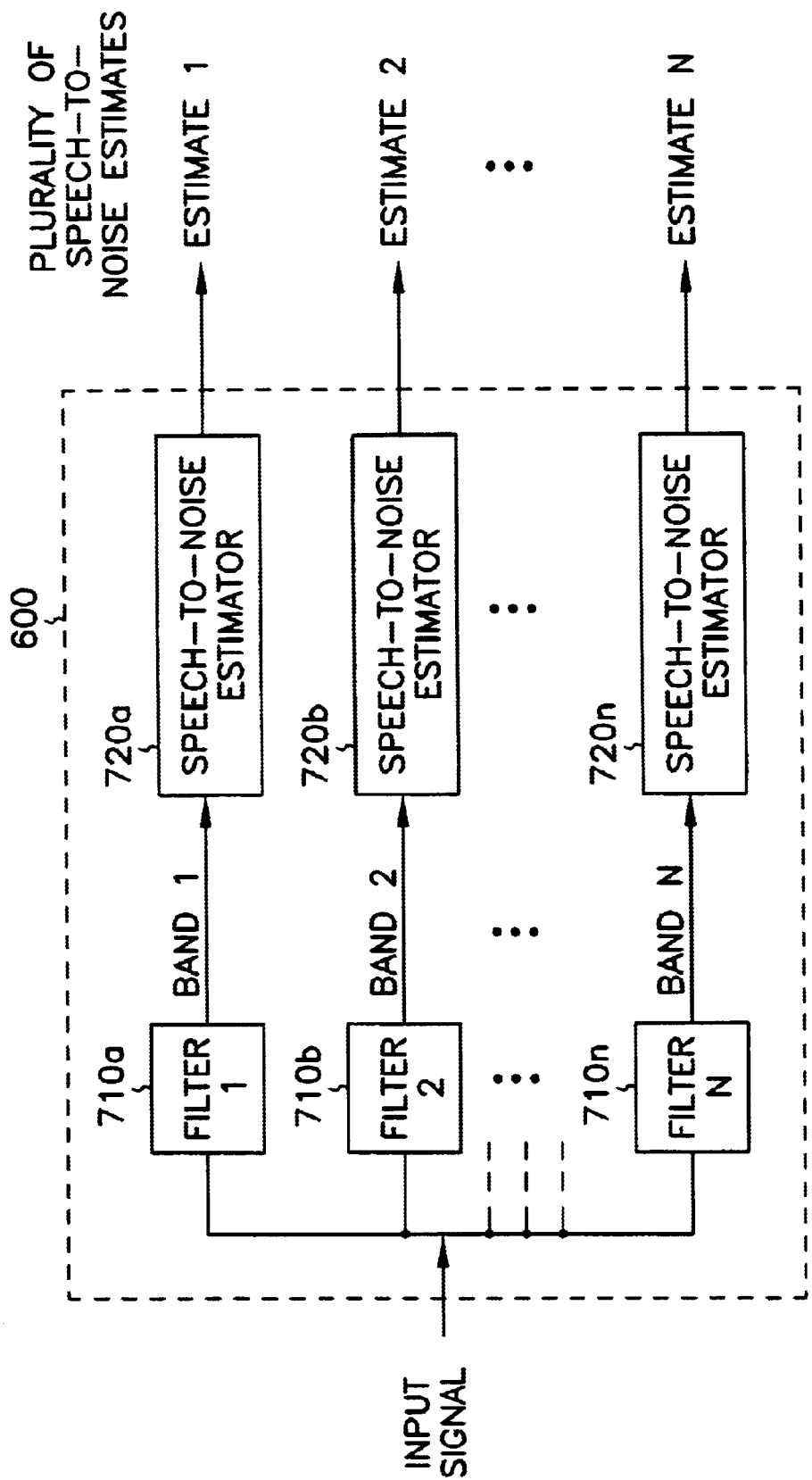
FIG. 7 shows a block diagram of a multiband speech-to-noise estimator, according to one embodiment of the present system.

FIG. 6 shows a block diagram of another embodiment of a speech content measurement system. Multiband speech-to-noise estimator 600 provides speech content estimates for a plurality of bands. One embodiment of multiband speech-to-noise estimator 600 is shown in FIG. 7, where two or more filters 710a–710n divide the input signal into two or more bands. Each band is processed by its respective speech-to-noise estimator 720a–720n to produce an estimate of the speech-to-noise ratio for each band. In one embodiment, the system uses a single speech-to-noise estimator 720 which is shared for each band to produce a plurality of speech-to-noise ratio estimates. In one embodiment, filters 710a–710x include bandpass filters. In one embodiment, filters 710a–710x include any combination of one or more bandpass filters, high pass filters and/or low pass filters.

Figure 8:
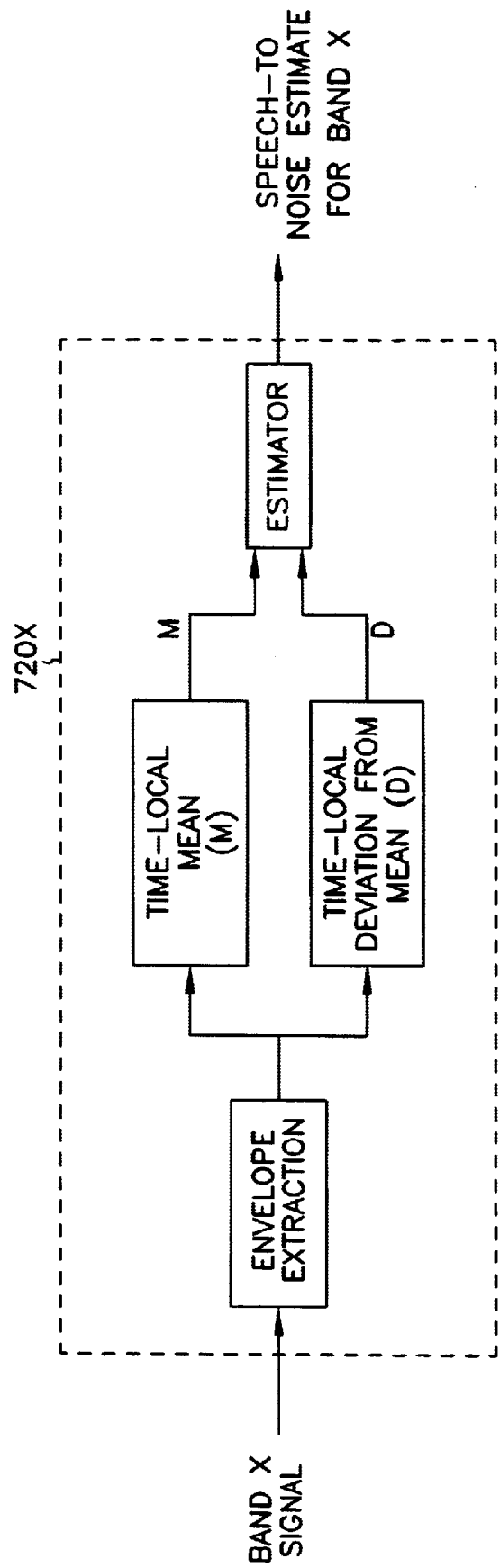
FIG. 8 shows a block diagram of a speech-to-noise estimator for a single band of a multiband system, according to one embodiment of the present system.
Figure 9:
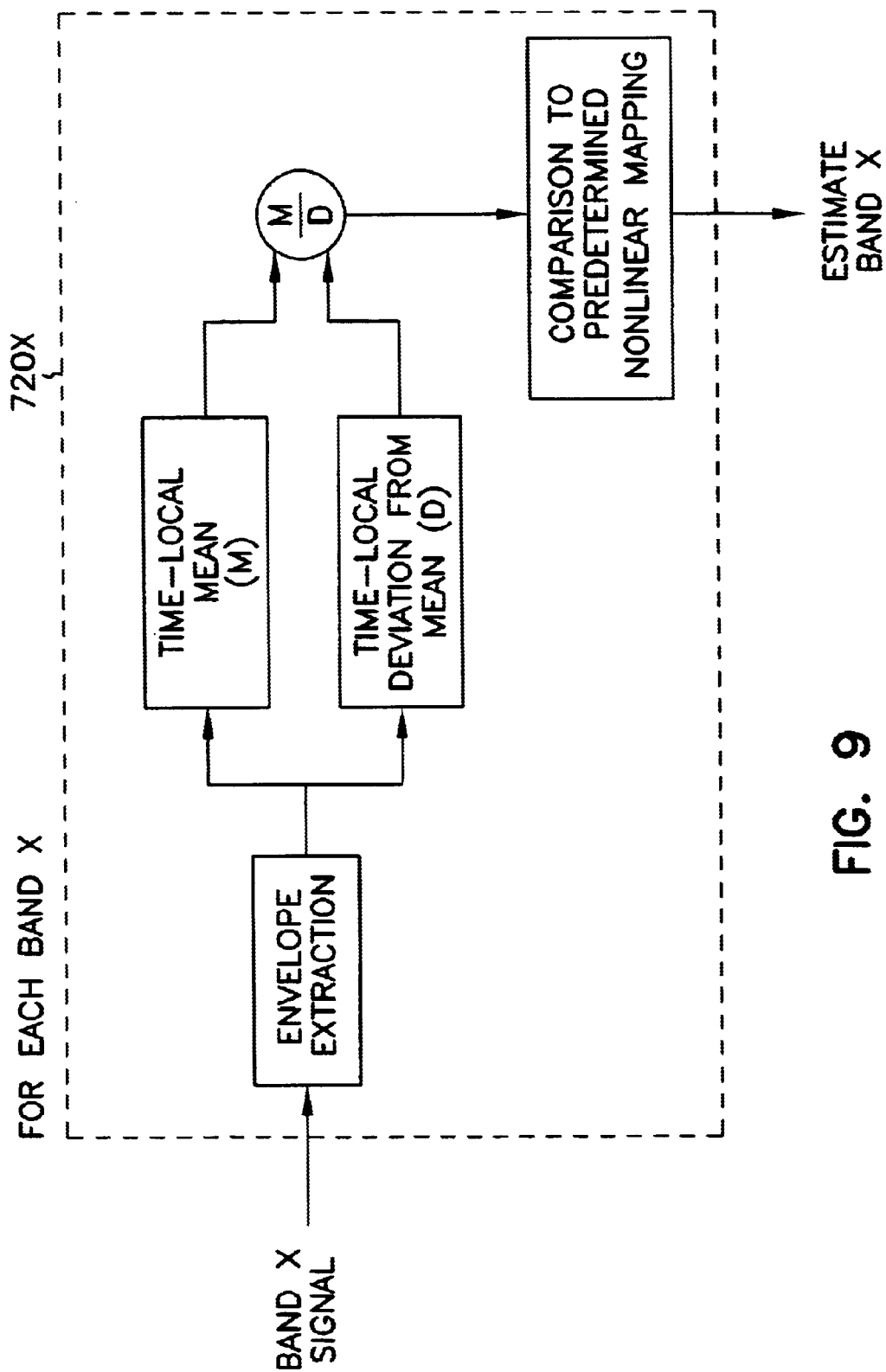
FIG. 9 shows a block diagram of a speech-to-noise estimator using a predetermined mapping of the ratio of envelope mean to envelope deviation from the mean to speech-to-noise ratio to estimate speech-to-noise ratio for a single band of a multiband system, according to one embodiment of the present system.

FIG. 8 shows one embodiment of speech-to-noise estimators 720a–720n, which is generically referred to as 720x. In this embodiment, an estimate of speech-to-noise ratio is provided using the relationship to M to D, which applies to individual bands and to the entire spectrum of the input signal. Thus, in varying embodiments, the estimate of speech-to-noise ratio in multiple bands may be obtained using an envelope extractor, time-dependent mean generator, time-dependent deviation estimator, and estimator for each band as shown in FIG. 8. Each estimate is provided for a particular band in this embodiment. Accordingly, in one embodiment, a ratio of M to D is produced and compared to a predetermined mapping of M/D for a known speech-to-noise ratio for a particular band and for a particular filter 710, as shown in FIG. 9.

As described above for the single band application, embodiments which use filters that preserve the phase structure and relationship of the input signals demonstrate a more accurate speech-to-noise ratio estimate. In such embodiments, any filtering prior to envelope extraction for each band will provide linear phase to avoid smearing the phase structure of the speech.

Envelope extraction is performed using the embodiments provided for above, and their equivalents.

As stated before, the standard deviation need not be used to obtain a metric related to speech-to-noise ratio. For example, any deviation measurement may be substituted without departing from the scope of the present system. Although any deviation measure could yield useful results, those measures that are linearly-related to the envelope will yield a M/D ratio that is independent of the level of the input signal.

In one embodiment a plurality of speech-to-noise estimates are used to determine the speech content of the input signal. In one embodiment, the speech-to-noise estimates are used to turn off one or more amplifiers when it is determined that the input signal is dominated by noise. In one embodiment, the speech-to-noise estimates are used to gradually adjust the gain of one or more amplifiers depending on the speech-to-noise ratio or the changes in speech-to-noise. In one embodiment, the speech-to-noise estimates are used to eliminate bands for processing when it is determined that the input signal is dominated by noise. In one embodiment, the speech-to-noise estimates are used to gradually eliminate bands for processing depending on the speech-to-noise ratio. In one embodiment an amplifier gain is adjusted when the speech-to-noise estimate falls within an upper and lower limit, and the gain is a function of the estimated speech-to-noise ratio. For example, the gain may be linearly adjusted when the speech-to-noise estimates lie between an upper and lower limit. Other adjustments may be performed without departing from the present system.

Determination of the speech-to-noise ratio in different filter bands has applications in artificial speech-recognition and noise suppression and reduction technologies. Other technologies which are not listed herein may benefit from this technology.

Figure 13:
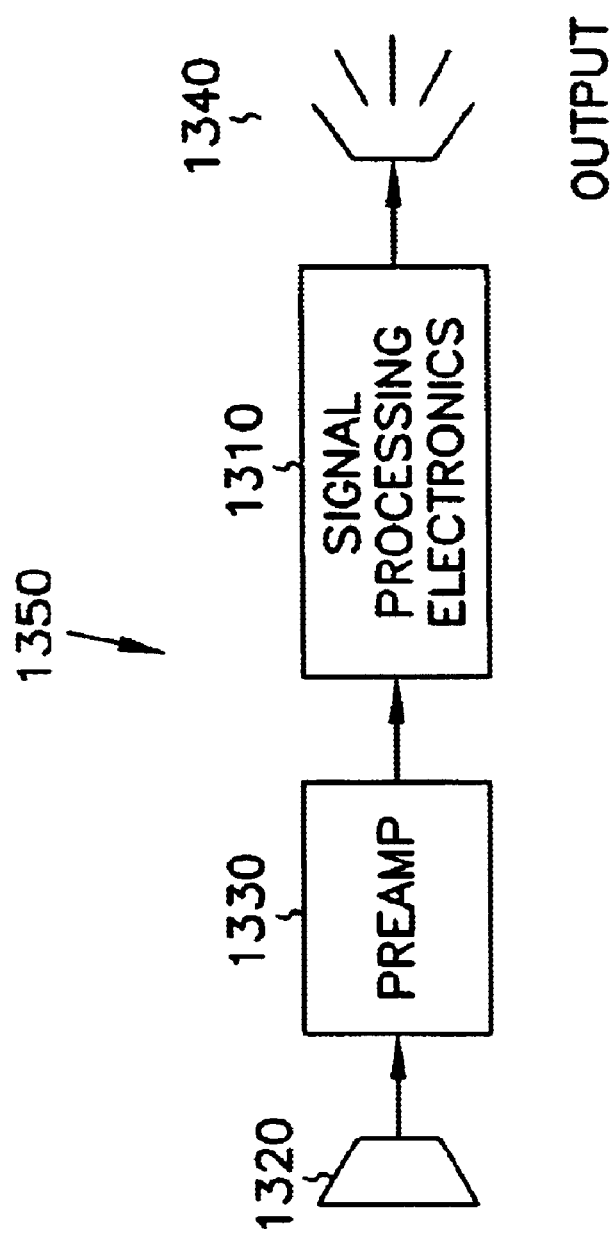
FIG. 13 shows a block diagram of an audio amplification system, such as a hearing aid using signal processing electronics, according to one embodiment of the present system.

Several applications of the present system are possible. One such application is in sound amplification, including, but not limited to, hearing aid technology, as shown in FIG. 13. To receive sound, hearing aid systems 1350 may use a microphone 1320 which converts audio signals into small electrical signals and a preamplifier 1330 to make the small electrical signals larger. The larger electrical signals are processed by analog and/or digital electronics 1310 to create a processed electrical signal according to the teachings provided herein. The processed electrical signal is converted back into sound with a number of devices, such as a speaker 1340.

In one application, the hearing aid is constructed to enhance the signal strength of the sound in audio bands where a person's hearing is impaired. For example, if the person has lost the ability to hear high frequency portions of the audio band (e.g., the person's hearing is impaired for high frequency sounds), then the electrical signal is processed to enhance the treble of the sound played through the speaker.

All amplification systems must contend with noise. Noise may be generated from a number of different sources, such as room noise and electronic noise. Sometimes the amount of signal amplification required to restore hearing, also known as signal "gain", is substantial. In cases where high gains are used, the hearing aid will amplify noise, such as room noise and amplifier electronic noise. This noise can be bothersome and can detract from the person's ability to distinguish speech from noise. In such cases, it is desirable to turn off the amplifier to avoid overamplification of noise, and then turn it back on when speech is present. In one embodiment, the switching of the amplifier is done for an entire signal. In another embodiment, the switching is performed individually for each independent frequency band. In an alternate embodiment, gain is reduced for bands where the noise is prevalent.

Figure 14:
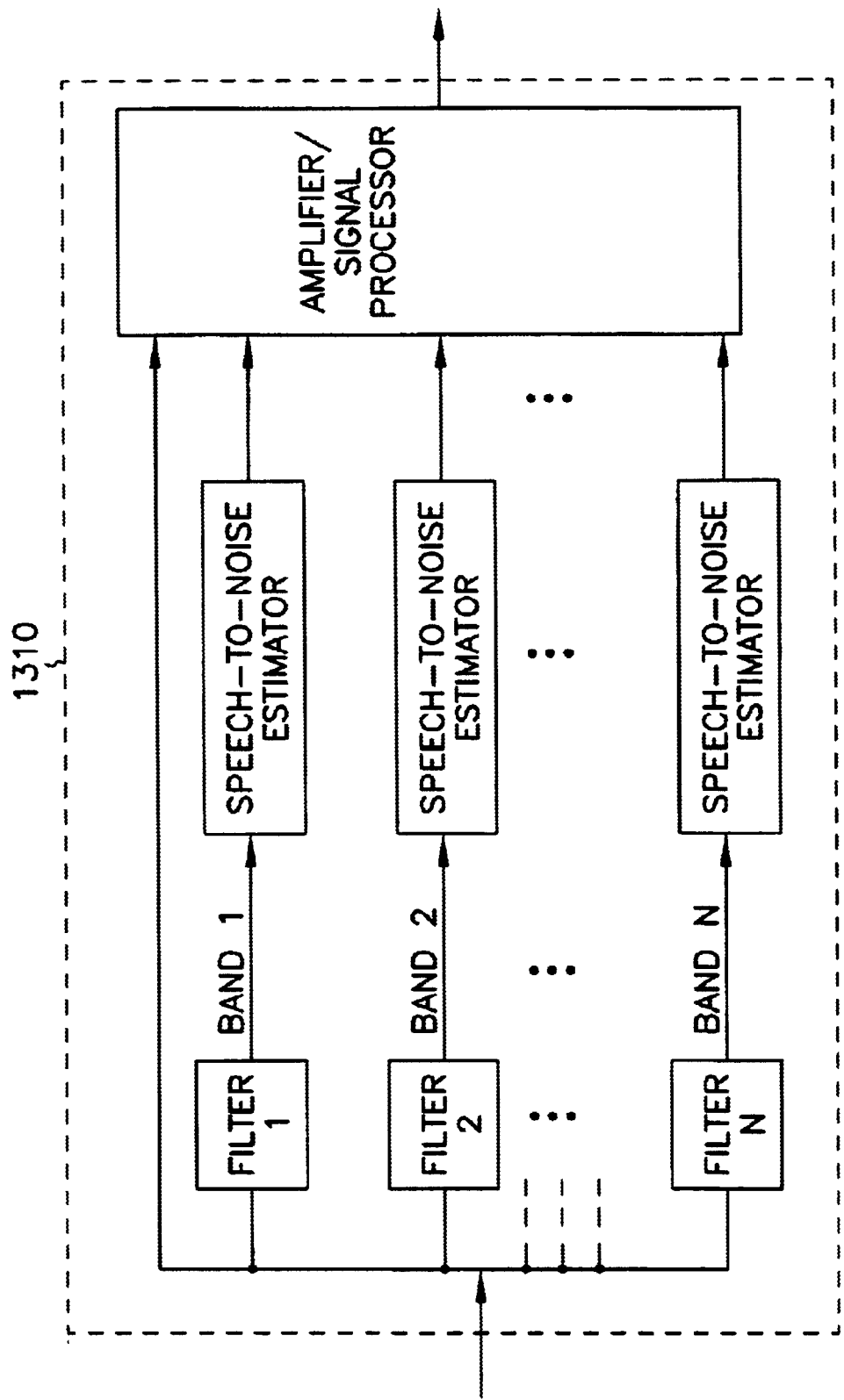
FIG. 14 shows a block diagram of multiband signal processing electronics using speech-to-noise estimates, according to one embodiment of the present system.

One embodiment of the present system overcomes these complications by providing a speech content measurement system for determining the speech-to-noise ratio for received sound. In one embodiment, the received sound is filtered and segmented into one or more sound bands by bandpass filtering, as shown in FIG. 14. Any, number of bands may be processed as shown in FIG. 14. The embodiment shown in FIG. 14 may be performed using analog circuit technology, digital circuit technology, or combinations of both technologies. These embodiments may be realized using dedicated or programmable hardware and/or software. In one embodiment, envelope measurements for each band are performed to generate mean envelope and deviation from envelope measurements. The M/D ratio is mapped to speech-to-noise ratio using a predetermined model. In one embodiment a multiple order polynomial is used to approximate a mapping between M/D and speech-to-noise ratio. The polynomial is used to calculate an estimated speech-to-noise ratio as a function of measured M/D. In another embodiment, the mapping is stored in the device and a lookup table approach is used. Such an embodiment may incorporate an interpolation model to approximate M/D ratios which depart from the stored mapping. In yet another embodiment a natural relationship between the M/D ratio and speech-to-noise ratio may be used to derive a mathematical model of the mapping.

A speech-to-noise ratio estimate for each sound band is produced. In one embodiment the speech-to-noise ratio estimates are used by the amplification system to control amplification of the received sound. Thus, the teachings of the present application may be used in a variety of applications, including, but not limited to hearing aid devices.

In one embodiment, the envelope measurements for each sound band include determination of a time-dependent mean M and a time-dependent deviation from the mean D. The ratio of the time-dependent mean and the time-dependent standard deviation is compared to a predetermined nonlinear mapping to determine an estimated speech-to-noise ratio for each sound band. The mapping is determined using one or more filters having filter characteristics approximating the filter characteristics for envelope extraction. These characteristics may include, but are not limited to center frequency, time constant, and bandwidth.

Figure 15:
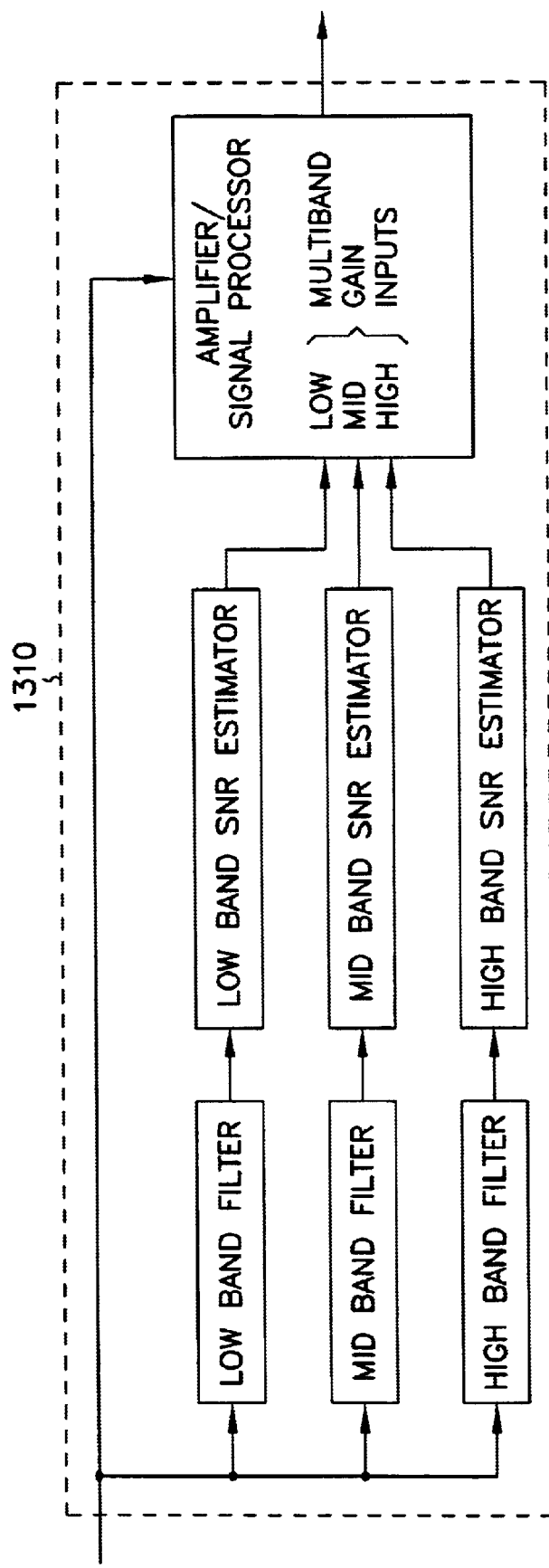
FIG. 15 shows a block diagram of triple band signal processing electronics using speech-to-noise estimates, according to one embodiment of the present system.

In one embodiment, three bands are used for signal processing. The bands represent a low frequency, midrange frequency, and high frequency. In one application to hearing aid technology, the bands represent bass, midrange, and treble. The M/D to speech-to-noise mappings for each band are predetermined and stored within the device. The resulting speech-to-noise estimates are used to control a multi-band amplifier, as shown in one embodiment by FIG. 15. In one embodiment, the system turns off amplification of bands where the speech-to-noise estimate indicates that non-speech sound is prevalent. In one embodiment, rather than turning off the amplification of the band, the system acts to reduce gain of the band. Thus, the amplification may be gradually or abruptly adjusted. Some embodiments may also ignore bands which are dominated by noise to enhance signal processing.

Figure 16:
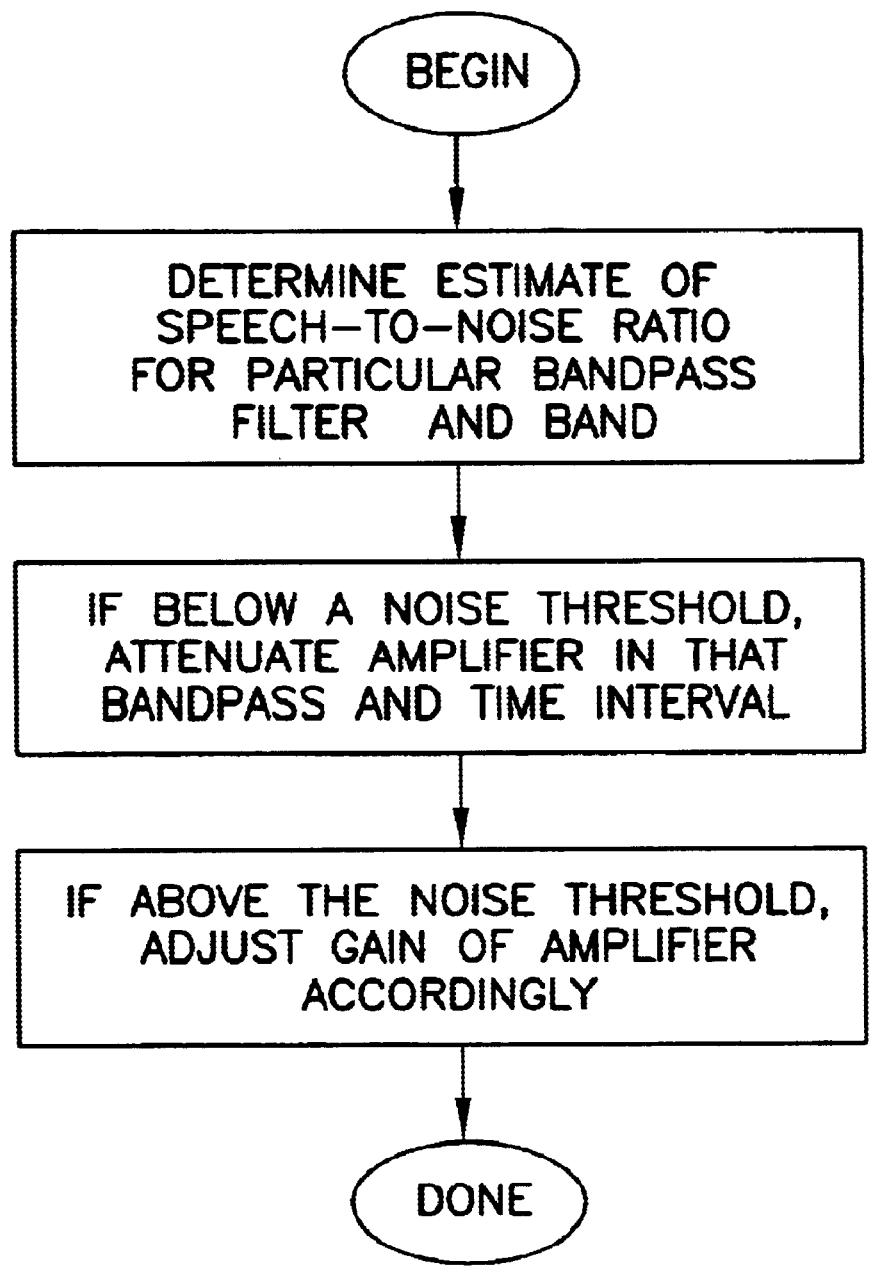
FIG. 16 shows a flow diagram of one example of the use of speech-to-noise estimates, according to one embodiment of the present system.

Many applications of the present system are possible. In one embodiment, the speech-to-noise estimate is compared to a threshold level and if the estimate is below the threshold, the signal is attenuated. If the estimate is above the threshold, then the gain of the amplifier may be adjusted for good hearing. Such a system may be embodied in single band embodiments or in multiband embodiments. FIG. 16 shows a flow diagram of one such system.

In one embodiment, the input signals are electrical signals from the preamplifier 1330 and the output signals are amplified electrical signals with a frequency dependent gain, as a function of the speech-to-noise estimates for each band. In one embodiment, the signal processor electronics 1310 perform analog-to-digital conversion on the signals prior to processing the signals in the digital domain. Subsequent processing and/or amplification may take place in the analog or digital domain. Thus, a number of different realizations using a variety of analog and digital electronics are possible in various embodiments of the present system.

One embodiment includes a three-channel system (using Chebyshev filters of order 4, 10, and 6, and crossover frequencies of 1789 and 4472 Hertz) that uses the absolute value in determining the envelope from the bandsplit filter outputs. The absolute value is then low pass filtered with a one-pole infinite impulse response (IIR) filter with a 5 millisecond time constant. This is then low pass filtered with a one-pole IIR filter with a 500 millisecond time constant to determine the mean, and the absolute value of the difference between the envelope and mean is lowpass filtered with a one-pole IIR filter with a 500 millisecond time constant to determine the deviation. In one embodiment, the difference of the logarithms of M and D is mapped through a 5th-order polynomial to determine an estimated speech-to-noise ratio. The coefficients of the polynomials (from high to low order; divided by 1000) for the three channels (low, mid, and high bands) are: (−1.8605, 6.1842, −8.0845, 5.2133, −1.6980, 0.2362), (−0.4691, 1.5508, −2.0115, 1.2831, 0.4350, 0.0745), (−1.0763, 3.5684, −4.7068, 3.0819, −1.0354, 0.1565). The foregoing example was provided to demonstrate one embodiment, and other variables and types of filters and mapping techniques may be performed without departing from the present system. Furthermore, analog and digital implementation are contemplated in the present system. In one embodiment, the M/D ratio is mapped through an nth order polynomial to determine estimated speech-to-noise ratio.

Other applications include, but are not limited to, artificial speech recognition, and in noise suppression and reduction technologies. Artificial speech-recognition systems are currently developing recognition techniques that require frequency-dependent speech-to-noise ratio information, such as provided by the present system in its various embodiments. Preliminary research with such algorithms has shown significant improvements over algorithms that do not use such information. This field represents a significant application area for the present technique, given the current strong investment in artificial speech-recognition technology. The noise suppression application operates by using the speech-to-noise information to characterize a filter that is applied to the corrupted speech signal. In cases of broadband noise this filtering may yield an output that is "easier to listen to", but not more intelligible, than the input. In cases of low-frequency, narrowband noise, both improvements in "ease of listening" and intelligibility could be expected. For example, by eliminating noisy bands the ease of listening is greatly enhanced.

Figure 17:
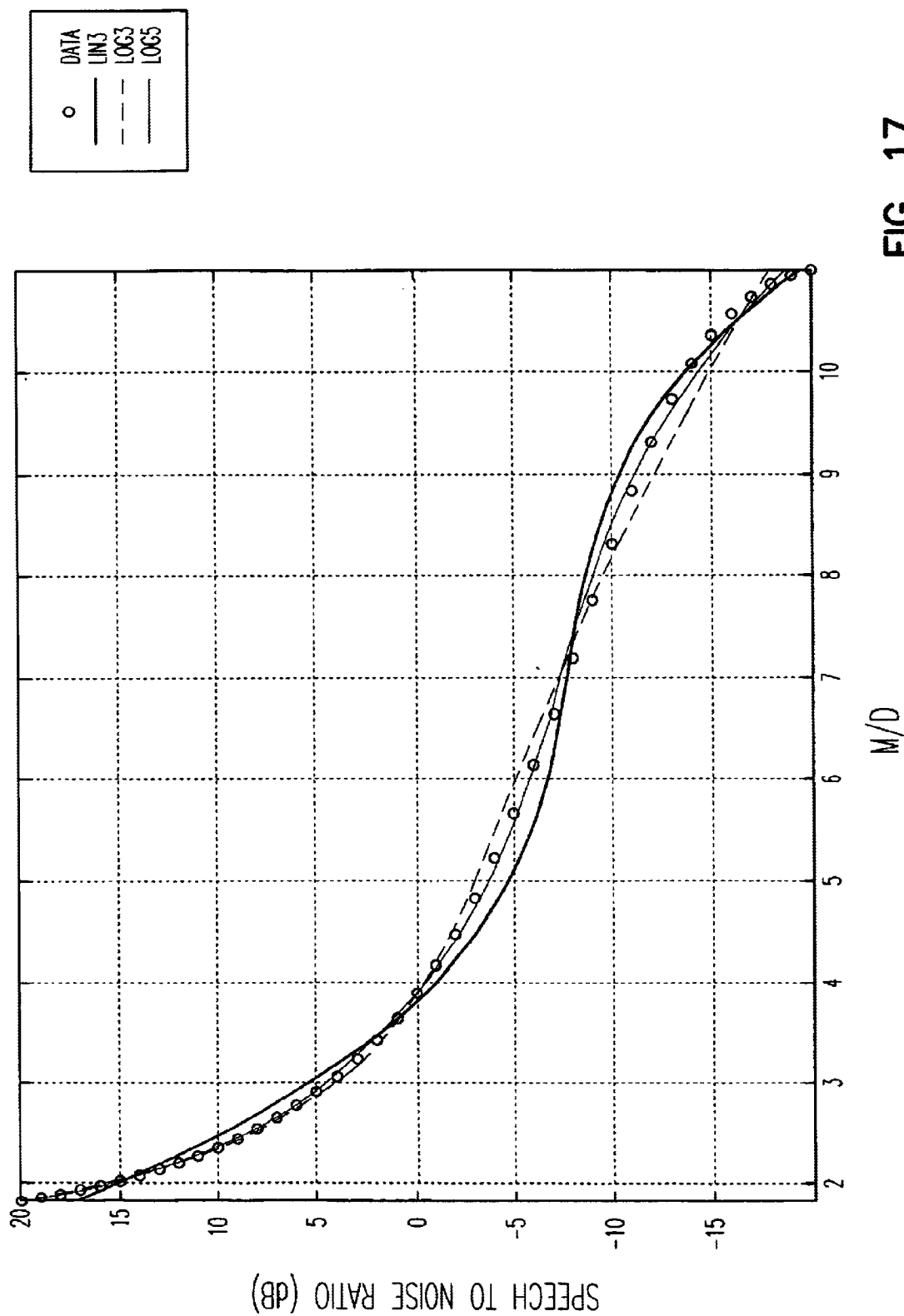
FIG. 17 shows a mapping of the ratio of envelope mean to envelope deviation from the mean to speech-to-noise ratio to estimate speech-to-noise ratio for a single band of a multiband system, according to one embodiment of the present system.

Determination of the mapping from M/D ratio to speech-to-noise ratio is done empirically in one embodiment. In one approach, a sufficient duration (approximately 60 seconds or more) of speech and white noise are summed at a given speech-to-noise ratio (for example, the ratio of the root-mean-square values of the zero-mean speech and noise are used) and the speech-to-noise estimation process is applied, yielding values of M/D at each time instant. The average value, across time, of M/D is recorded, and the process repeated at a different speech-to-noise ratio, covering the range of interest. The circles in FIG. 17 show the result of this measurement process for one particular filter band. The solid and dashed lines represent 3rd-order polynomial fits to the measured data using the M/D data itself (LIN3), and the logarithm of the M/D data (LOG3), respectively. The dash-dot line represents a 5th-order polynomial fit (LOG5) to the logarithm of the M/D data.

Figure 18:
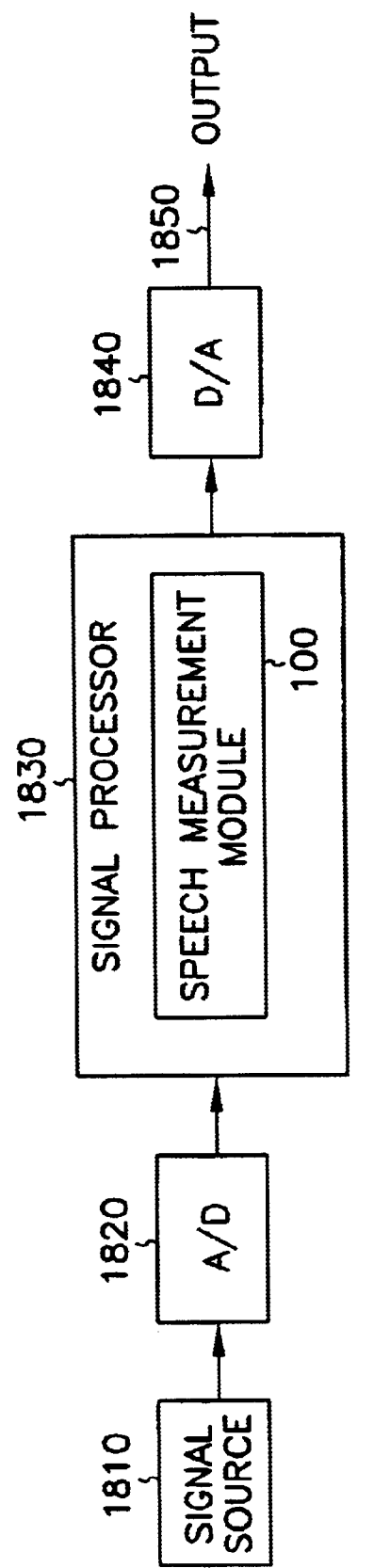
FIG. 18 is a block diagram of a signal processing system using a speech measurement module, according to one embodiment of the present system.

FIG. 18 shows one embodiment of a signal processing system incorporating the speech measurement module 100. A signal source 1810 receives audio signals and converts them to electrical energy. The electrical signals are converted to digital signals by analog-to-digital converter 1820. The digital samples are processed by signal processor 1830 which includes or is connected to speech measurement module 100. The signals are processed as demonstrated herein in any of several embodiments. The resulting signals are converted back into analog form by digital-to-analog convertor 1840 to provide output 1850. Other embodiments exist and the system shown herein is intended to demonstrate one embodiment of a system incorporating the speech measurement module 100.

Possible applications of the technology include, but are not limited to, hearing aids, speech recognition, and digital sound processing. Those skilled in the art will readily recognize how to realize the different embodiments provided herein using novel combinations of hardware, software and firmware. For instance, the speech measurement module may be realized in one embodiment using existing microprocessor technologies. Several other embodiments, applications and realizations are possible without departing from the present invention.

The subject matter of this description has been described in detail, and those of skill in the art will recognize that many modifications and changes may be made thereto without departing from the spirit and the scope of the present invention. For example, the sampling rates and organizations of the system may differ without departing from the present invention. Various analog and digital embodiments of the systems described herein are possible without departing from the recited subject matter. Furthermore, various embodiments may digitize the input signal and perform digital signal processing on the resulting digital representation. Alternate embodiments may digitize the envelope of the input signal and perform digital signal processing on the envelope. Other variations may exist which do not depart from the recited subject matter. Furthermore, the embodiments described herein are not intended in an exclusive or limiting sense, and that scope of the invention is as claimed in the following claims and their equivalents.

What is claimed is:

1. A method, comprising:

receiving an input signal having speech content;

extracting a signal related to a time-dependent power of the input signal, the signal representative of at least a portion of the speech content of the input signal;

determining a time-dependent mean of the signal, M, in the time domain;

determining a time-dependent deviation of the signal from the mean, D, in the time domain using the signal; and estimating a time-dependent speech-to-noise ratio from M and D.

2. The method according to claim 1, wherein the signal is a non-negative function of the input signal.

3. The method according to claim 1, wherein the estimating includes comparing M and D to a predetermined mapping of a relationship between M and D to speech-to-noise ratio to obtain an estimated speech-to-noise ratio.

4. The method according to claim 1, further comprising converting the input signal to a digital signal.

5. The method according to claim 1, wherein the signal is converted to a digital signal.

6. The method according to claim 1, comprising:

filtering the input signal within a first bandpass frequency range to produce the signal.

7. The method of claim 1, wherein the deviation is computed using the standard deviation of the signal.

8. The method of claim 1, wherein the deviation is computed using an absolute value of the signal minus the mean.

9. The method according to claim 1, wherein the time-dependent mean is extracted over a discrete time interval.

10. The method according to claim 1, wherein the time-dependent mean is extracted recursively in time.

11. The method according to claim 1, wherein the extracting comprises full wave rectification of the input signal.

12. The method according to claim 1, wherein the extracting comprises half wave rectification of the input signal.

13. The method according to claim 1, wherein the extracting comprises squaring of the input signal.

14. The method according to claim 1, wherein the extracting comprises magnitude extraction of the input signal.

15. The method according to claim 1, wherein the extracting comprises low pass filtering of a rectified, squared, or magnitude extracted version of the input signal.

16. The method according to claim 1, wherein the extracting comprises Hilbert transforming the input signal.

17. The method according to claim 1, wherein a non-negative element is used for time-dependent power extraction of the input signal.

18. The method according to claim 1, wherein the estimated speech-to-noise ratio is used to set an amplifier gain in a first bandpass frequency range.

19. The method according to claim 1, wherein the estimated speech-to-noise ratio is used to determine if speech-like sound is present in the input signal.

20. The method according to claim 1, wherein if the estimated speech-to-noise ratio is below a threshold, processing the input signal as noise.

21. The method according to claim 1, wherein if the estimated speech-to-noise ratio is below a threshold, decreasing the gain of an amplifier in a first bandpass frequency range.

22. The method according to claim 1, wherein if the estimated speech-to-noise ratio is above a threshold, processing the input signal as speech.

23. The method according to claim 1, wherein if the estimated speech-to-noise ratio is above a threshold, increasing the gain of an amplifier in a first bandpass frequency range.

24. The method according to claim 1, wherein the estimated speech-to-noise ratio is used to gradually adjust the gain applied to an amplifier in a first bandpass frequency range.

25. The method according to claim 1, wherein the estimated speech-to-noise ratio is used to ignore input signals in a first bandpass frequency range if it is determined that the input signals in the first bandpass frequency range are dominated by noise.

26. The method according to claim 1, wherein the signal is an envelope of the input signal.

27. The method according to claim 26, wherein the envelope is converted to a digital signal.

28. The method of claim 26, wherein the deviation is computed using a standard deviation of the envelope.

29. The method of claim 26, wherein the deviation is computed using an absolute value of the envelope minus the mean.

30. A method, comprising:
receiving an audio signal having speech content;
converting the audio signal to an electrical signal including the speech content;
converting the electrical signal to a digital representation;
bandpass filtering the electrical signal using one or more digital filters to produce a plurality of filtered digital signals;
for each digital signal of the plurality of filtered digital signals:
extracting an envelope related to a time-dependent power of the electrical signal, the envelope representative of at least a portion of the speech content of the electrical signal;
determining a time-dependent mean of the envelope, M, in the time domain;
determining a time-dependent deviation of the envelope from the mean, D, in the time domain using the envelope; and
estimating a time-dependent speech-to-noise ratio from M and D using a predetermined mapping or relationship between M and D to speech-to-noise ratio;
producing a processed digital signal using the plurality of filtered digital signals and their respective estimated time-dependent speech-to-noise ratios; and
converting the processed digital signal to a processed analog signal.

31. The method according to claim 30, wherein the extracting comprises low pass filtering of a rectified, squared, or magnitude extracted version of the signal.

32. The method according to claim 30, wherein the extracting comprises Hilbert transforming the signal.

33. The method according to claim 30, wherein a non-negative element is used for time-dependent power extraction of the si envelope.

34. The method according to claim 30, wherein the estimated speech-to-noise ratios are used to set amplifier gains in a plurality of amplifiers.

35. The method according to claim 30, wherein the estimated speech-to-noise ratios are used to determine if speech-like sound is present in each band of the audio signal.

36. The method according to claim 30, wherein if an estimated speech-to-noise ratio is below a threshold, processing the time-dependent signal in its respective band as noise.

37. The method according to claim 30, wherein if an estimated speech-to-noise ratio is below a threshold, decreasing a gain of an amplifier.

38. The method according to claim 30, wherein if an estimated speech-to-noise ratio is above a threshold, processing the time-dependent signal as speech.

39. The method according to claim 30, wherein if an estimated speech-to-noise ratio is above a threshold, increasing a gain of an amplifier in a first bandpass frequency range.

40. The method according to claim 31, wherein if an estimated speech-to-noise ratio is above a threshold, increasing a gain of an amplifier in a first bandpass frequency range.

41. The method according to claim 30, wherein if an estimated speech-to-noise ratio is below a threshold, ignoring the time-dependent signal in its respective band as noise.

* * * * *

UNITED STATES PATENT AND TRADEMARK OFFICE
CERTIFICATE OF CORRECTION

PATENT NO.     : 6,718,301 B1
DATED          : April 6, 2004
INVENTOR(S)    : Woods It is certified that error appears in the above-identified patent and that said Letters Patent is hereby corrected as shown below:

Column 14,
Line 26, after "the" delete "si".

Signed and Sealed this

Twenty-second Day of June, 2004

JON W. DUDAS
*Acting Director of the United States Patent and Trademark Office*